United States Patent
Lee et al.

(10) Patent No.: US 9,530,949 B2
(45) Date of Patent: Dec. 27, 2016

(54) BONDING LED DIE TO LEAD FRAME STRIPS

(71) Applicant: KONINKLIJKE PHILIPS N.V., Eindhoven (NL)

(72) Inventors: Sze Kuang Lee, San Jose, CA (US); Paul Scott Martin, San Jose, CA (US); Albrecht Johannes Kraus, San Jose, CA (US); Chunheng Kang, San Jose, CA (US); Hui Ling Pan, San Jose, CA (US); Long Yin, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/901,705

(22) PCT Filed: Jun. 18, 2014

(86) PCT No.: PCT/IB2014/062347
§ 371 (c)(1),
(2) Date: Dec. 28, 2015

(87) PCT Pub. No.: WO2014/207620
PCT Pub. Date: Dec. 31, 2014

(65) Prior Publication Data
US 2016/0329473 A1     Nov. 10, 2016

Related U.S. Application Data

(63) Continuation of application No. PCT/CN2013/000784, filed on Jun. 28, 2013.

(51) Int. Cl.
*H01L 33/00* (2010.01)
*H01L 33/62* (2010.01)
(Continued)

(52) U.S. Cl.
CPC ........... *H01L 33/62* (2013.01); *H01L 25/0753* (2013.01); *H01L 33/56* (2013.01)

(58) Field of Classification Search
CPC .......... H01L 33/20; H01L 33/52; H01L 33/58; H01L 33/62
(Continued)

(56) References Cited

U.S. PATENT DOCUMENTS

2009/0065799 A1     3/2009   Kim et al.
2009/0283781 A1    11/2009   Chan et al.
(Continued)

FOREIGN PATENT DOCUMENTS

DE           10025563 A1    12/2001
DE       202010005312 U1     9/2010
(Continued)

OTHER PUBLICATIONS

EPO as ISA for PCT/IB2014/062347, filed Jun. 18, 2014, "International Search Report and Written Opinion," dated Sep. 16, 2014, 13 pages.

*Primary Examiner* — Tan N Tran
(74) *Attorney, Agent, or Firm* — Patent Law Group LLP; Brian D. Ogonowsky

(57) ABSTRACT

In one embodiment, an LED bulb includes a plurality of metal lead frame strips, including at least a first strip, a second strip, and a third strip. First LED dies have their bottom electrodes electrically and thermally connected to a top surface of the first strip. Second LED dies have their bottom electrodes electrically and thermally connected to a top surface of the second strip. The top electrodes of the first LED dies are wire bonded to the second strip, and the top electrodes of the second LED dies are wire bonded to the third strip to connect the first LED dies and second LED dies in series and parallel. The strips are then bent to cause the
(Continued)

LED dies to face different directions to obtain a wide emission pattern in a small space. The strips are then enclosed in a thermally conductive bulb having electrical leads.

14 Claims, 9 Drawing Sheets

(51) Int. Cl.
*H01L 25/075* (2006.01)
*H01L 33/56* (2010.01)

(58) Field of Classification Search
USPC .......................................... 257/98, 99, 100
See application file for complete search history.

(56) References Cited

U.S. PATENT DOCUMENTS

2011/0260179 A1 10/2011 Hung
2013/0058082 A1 3/2013 Hirsh et al.

FOREIGN PATENT DOCUMENTS

EP 0364806 A2 4/1990
WO 2008078791 A1 7/2008

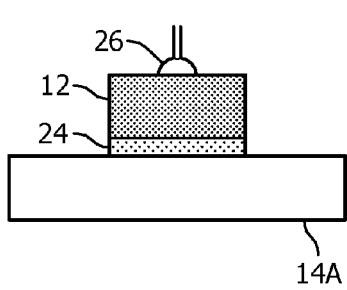
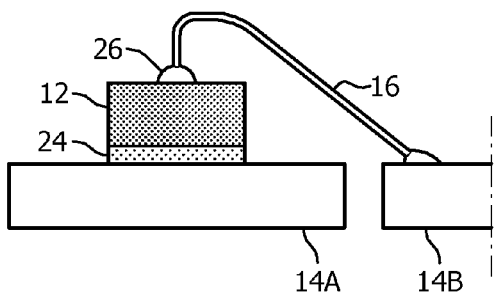
FIG. 4  FIG. 5
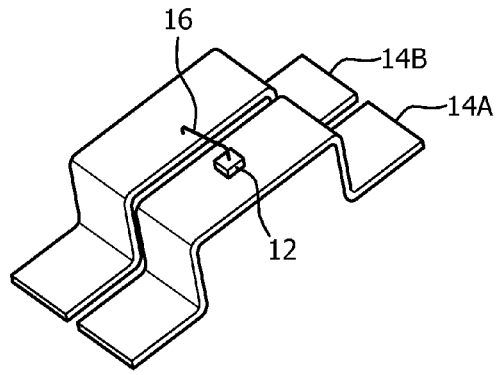
FIG. 6
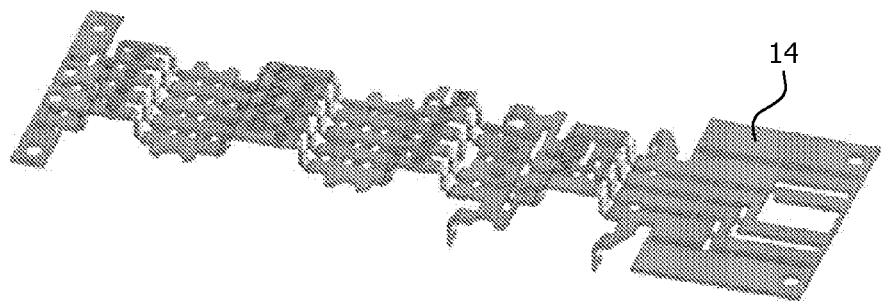
FIG. 7

BONDING LED DIE TO LEAD FRAME STRIPS

CROSS-REFERENCE TO RELATED APPLICATIONS

The present application is a §371 application of International Application No. PCT/IB2014/062347 filed on Jun. 18, 2014 and titled "Bonding LED Die to Lead Frame Strips," which claims the benefit of PCT/CN2013/000784, filed Jun. 28, 2013. Both PCT/IB2014/062347 and PCT/CN2013/000784 are incorporated herein.

FIELD OF THE INVENTION

This invention relates to the packaging of light emitting diodes (LEDs) and, in particular, to a technique for forming an LED module containing a plurality of interconnected LED dies and having good heat sinking capability.

BACKGROUND

High power, high brightness LEDs generate high heat in a very small area (e.g., 1 mm$^2$) and this heat must be efficiently dissipated while maintaining a small package (or module) size. Further, to generate a very high flux, there may be multiple LEDs in the same package. Such LEDs are usually connected in series and/or parallel within the package.

In a common package for a high power LED, the bottom metal pad of the LED die is soldered to a top metal pad of a thermally conductive submount (e.g., a ceramic), and the LED die is encapsulated. The external submount metal pads (electrically connected to the anode and cathode of the LED die) are then soldered to pads of a printed circuit board (PCB), where the PCB helps sink heat from the LED and provides power to the LED die. The LED's thermal coupling to the submount and PCB is not as good as a thermal coupling directly to a metal heat sink. When there are multiple LEDs in a single package connected in series, the thermal design is more complex since the LEDs cannot share a large metal pad for spreading heat.

This problem of heat dissipation is especially severe in the field of automobile headlights, where multiple high power LEDs must deliver high flux in a small space near a focal point in an enclosed headlight parabolic reflector.

Various prior art LED modules have been proposed for packaging multiple LEDs but there are still problems with heat sinking and size that make the packages unsuitable for an automobile headlight. Examples of this prior art include U.S. Pat. Nos. 7,806,560; 8,371,723; 2013/0005055; and 2008/0074871.

Therefore, what is needed is a technique for forming an LED module that has a relatively small size, has excellent heat sinking capability, and can contain an array of high power LEDs that may be used in automobile applications, such as headlights, indicator lights, or taillights.

SUMMARY

In one embodiment, high power vertical LEDs are used in a module that is inserted into a socket of a headlight, indicator light, or tail light assembly, or for another application. Each of the LED dies has a bottom metal pad which serves as a cathode and a thermal conductor. A top electrode is a wire bond pad and serves as an anode.

To provide the desired flux and voltage drop (such as for a 12V supply in an automobile), multiple LEDs are connected in parallel, and the parallel groups are connected in series.

In a simple example, it is assumed that 12 LED dies are required to generate the desired flux, where there are four groups of LED dies connected in parallel (three in each group), and the four groups are connected in series across the power terminals. The LEDs may emit white light by being blue GaN based LEDs with a yellow phosphor over them, such as a YAG phosphor.

The three LED dies in a first group have their bottom pads directly soldered or silver-epoxied to a common first copper strip, which is part of a lead frame. The three LED dies in a second group have their bottom pads directly soldered to a common second copper strip, which is part of the lead frame. The three LED dies in a third group have their bottom pads directly soldered to a common third copper strip, which is part of the lead frame. The anodes of the LED dies in the first group are wire-bonded to the second copper strip. The anodes of the LED dies in the second group are wire-bonded to a third copper strip. The anodes of the LED dies in the third group are wire-bonded to a fourth copper strip. All the copper strips have a reflective silver layer for reflectance.

In another embodiment, the LED dies have a bottom metal pad which serves as an anode and a thermal conductor. A top electrode is a wire bond pad and serves as a cathode. The cathodes of the LED dies in the first group are wire-bonded to the second copper strip. The cathodes of the LED dies in the second group are wire-bonded to a third copper strip. The cathodes of the LED dies in the third group are wire-bonded to a fourth copper strip. A transparent encapsulant is molded around the LED dies and the copper strips, such as at three locations, to allow the strips to be bent between the encapsulation castings yet providing a mechanical coupling between the strips. In one embodiment, the transparent encapsulant is used as an optically transmissive enclosure.

The copper strips are then bent, such as in a triangular or U-shape, so that the ends of the copper strips are in the same plane to form anode and cathode end leads of the array of LEDs. A current controller is coupled between the ends of the strips and power leads of the module. The ends of the strips may snap into a flange for connection to the current controller.

The strips are much wider than needed to carry the required current since they are also used for heat sinking and reflection. In one embodiment, the strips are more than five times the width of the LED dies.

Therefore, all the LED dies have their light emitting surfaces facing outward and around a wide angle. Since there is side emission from the LED dies, the light emission may be generally spherical.

The electrical structure is then enclosed in a transparent protective bulb for protection of the electrical structure and to give the module a standard form, such as a T20 bulb form, for connection to a standard socket. The bulb may be a clear, thermally conductive plastic to encapsulate the LEDs and lead frame. The wide emission pattern of the bent electrical structure is particularly suitable for use in a reflective assembly.

In another embodiment, the electrical structure is covered with the optically transmissive enclosure to form a primary optics, and then the electrical structure with the optically transmissive enclosure is enclosed in a thermal conductive plastic for protection of the electrical structure, dissipation of the heat and to give the module a standard form. The thermal conductive plastic encapsulates the lead frame, and contacts the optically transmissive enclosure with out-light surfaces of the electrical structure exposed.

In another embodiment, the bulb may allow air to circulate within the bulb to cool the copper strips and LED dies. Since there is an air gap above, below, and on the sides of each oversized copper strip, the LED dies are cooled even in a headlight or tail light reflector assembly.

This concept may be applied to any number of LED dies connected in parallel and series. Different color LEDs or different types of LEDs may be mounted on the same copper strip or mounted on different strips in the same lamp.

The resulting module uses relatively few parts, improving its reliability.

In another embodiment, the copper strips are not bent and are supported in a reflective cup. The strips spread heat and connect the LED dies in series and parallel.

BRIEF DESCRIPTION OF THE DRAWINGS

FIG. 4 illustrates a gold ball placed on the top electrode of the LED die for a wire bond.

FIG. 5 illustrates a gold wire connecting the top anode of the LED die to the adjacent copper strip.

FIG. 6 is a perspective view of raised sections of the copper strips, with one LED dies mounted on the raised section.

FIG. 7 is a perspective view of a lead frame with raised sections.

Elements that are the same or similar are labeled with the same numeral.

DETAILED DESCRIPTION

Figure 1:
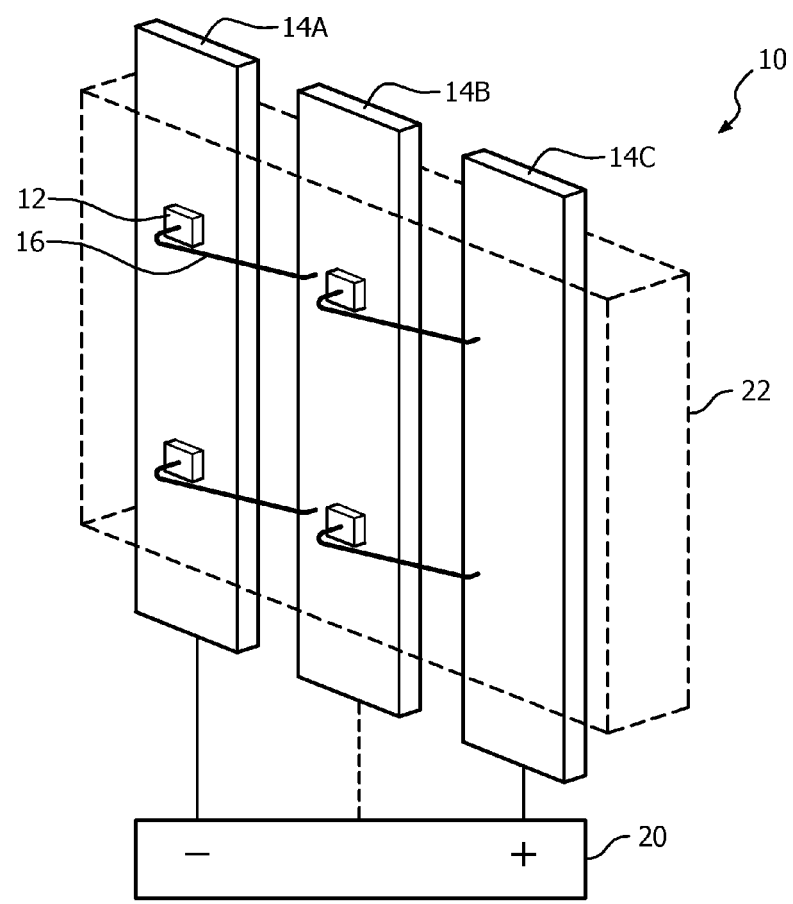
FIG. 1 is a perspective view of a section of a module, showing four LED dies mounted on copper strips (part of a single lead frame), where the LED dies are connected in series and parallel.

FIG. 1 is a perspective view of a section of a module 10, showing four LED dies 12 mounted on copper strips 14A and 14B (part of a lead frame), where the LED dies 12 are connected in series and parallel. The strip 14C is used as an interconnect and is part of the lead frame. The strip 14C could be narrower than the strip 14A and the strip 14B. The strips 14, during fabrication of the module 10, are provided in a large, stamped sheet along with strips for other modules. The strips 14 are connected together by thin cross-pieces of copper that will later be cut off during singulation.

The strips 14 will typically be on the order of 0.25-0.5 mm thick and at least 2 mm wide for good heat sinking. Since the LED dies 12 are typically less than 1 mm wide, the strips 14 are much wider than required for carrying the LED current. In one embodiment, the strips 14 are over four times the width of the LED dies 12. The strips 14 are plated with silver to be highly reflective, so providing wide strips 14 also provides the synergy of good heat conduction, good reflectance of side light, and low resistance.

For an automobile headlight application, the LED dies 12 may be white light LEDs comprising a blue emitting LED with a YAG phosphor. Other types of LEDs may also be used depending on the application. Red or amber LEDs may be used for tail lights.

The LED dies 12 in the examples are vertical types, with a metal layer on the bottom acting as a cathode and a smaller electrode on top acting as an anode. Other types of LED dies may be used, including vertical types with an anode on top and a cathode on the bottom, lateral LEDs with both electrodes on top and a metal thermal pad on the bottom. Flip chips may also be used, but there is additional complexity in electrically connecting to the bottom electrodes.

The LED dies 12 on a single strip 14A or 14B are connected in parallel since their bottom electrodes are bonded to their respective strips 14, and their top electrodes are wire bonded, via gold wires 16, to an adjacent strip 14. This also results in the groups of parallel LED dies 12 to be connected in series.

Although only two groups of parallel-connected LED dies 12 are shown in FIG. 1, there may be any number of LED dies 12 mounted on a single strip 14, and there may be any number of strips 14 for connecting the groups of LED dies 12 in series. The number of series connections affects the voltage drop across the module. The optimum voltage drop across the module and the number of LED dies 12 used depends on the particular application.

In another embodiment, there are four groups of LED dies, each group being mounted on a single copper strip, and three LED dies in each group connected in parallel on the strip. The groups are connected in series. Five copper strips are used in that embodiment.

The LED dies on a single strip or in a single row may be different colors. For example, some LED dies may emit red light, some may emit amber light, and some may be blue LEDs with a phosphor to emit white light. The LED dies on a single strip may be different wavelength, different color temperature or different flux also.

If one LED die on a strip is different from another LED die on the strip and has a different voltage drop, their anode wires 16 may be connected to different voltages. This may be done by connecting the anode wires to different strips, since each strip is at a different voltage.

In one embodiment, ends of the strips are electrically connected to terminals of the module for connection to a power supply, and power may be selectively applied to different combinations of the strips to turn some LED dies on but not others. For example, in FIG. 1, applying power across strips 14A and 14C will turn all the LED dies 12 on, but applying power across only strips 14A and 14B will only turn on the LED dies 12 mounted to the strip 14A. Similarly, applying power across strips 14B and 14C will only turn on the LED dies 12 on the strip 14B. This technique can be used to create different color emissions from a single module, and colors on different strips may be selectively combined to create a wide range of colors. There may be any number of groups of LED dies 12 (each group on a different strip) connected in series. If all LED dies emit the same color, power may be selectively applied across different combinations of strips to achieve a desired brightness.

In an example of a tail light that is to emit bright red light for indicating a stop, a bright amber light for turning, and a less bright amber light that is continuously on, such red and amber LED dies may be mounted on respective strips, and power may be selectively applied across different combinations of the strips, so that the strip(s) with the red LED dies are turned on when there is a stop, all of the amber LED dies are turned on when there is a turn, and only some of the amber LED dies are turned on continuously.

A driver 20 is shown supplying the required current through different combinations of the strips 14.

Ultimately, the LED dies 12 and strips 14 are encased in a transparent, molded epoxy casting 22 at various sections with optional openings for lenses over the LED dies 12. The casting 22 provides mechanical support, and protection of the LED dies 12 as well as wire bonds 16.

In another embodiment, the casting 22 could also be formed directly in a particular shape as the transparent encapsulant (primary optics) to realize different emission patterns, as well as to provide mechanical support, and protection of the LED dies 12 and wire bonds 16. The casting 22 material should have good optical transmissivity of at least 50%. The transparent encapsulant could cover part of LED dies, or all LED dies. Preferably, the transparent encapsulant covers at least two LED dies. Multiple transparent encapsulants could be formed on the lead frame to cover the LED dies, and to further form an optically transmissive enclosure.

Figures 2, 3:
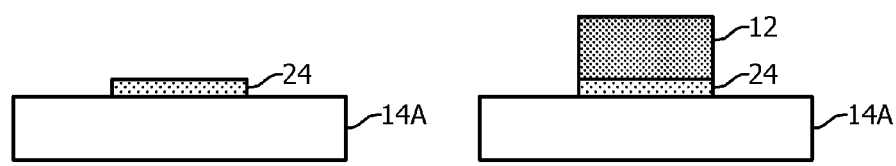
FIG. 2 is a cross-sectional view of one of the strips of FIG. 1 with a layer of silver epoxy in an LED die area.
FIG. 3 illustrates an LED die electrically and thermally attached to the strip via the silver epoxy after a curing step.

FIG. 2 is a cross-sectional view of one of the strips 14A of FIG. 1 with a layer of thermally conductive silver epoxy 24 in an LED die area. The epoxy 24 may be printed or deposited in other ways.

FIG. 3 illustrates an LED die 12 electrically and thermally attached to the strip 14A via the silver epoxy 24 after a heat curing step.

FIG. 4 illustrates a gold ball 26 ultrasonically bonded to the top electrode of the LED die 12 for a wire bond. Similar gold balls may be bonded to the adjacent strip 14B.

FIG. 5 illustrates a gold wire 16 ultrasonically bonded between the gold ball 26 and the adjacent strip 14B, creating a parallel and series connection as discussed above.

FIGS. 6-7 illustrate lead frame strips 14 having a raised section where the LED dies 12 are to be mounted to simplify the epoxy casting step. The strips 14 may also have indented areas to define where bends are to occur in a later step.

Figure 8:
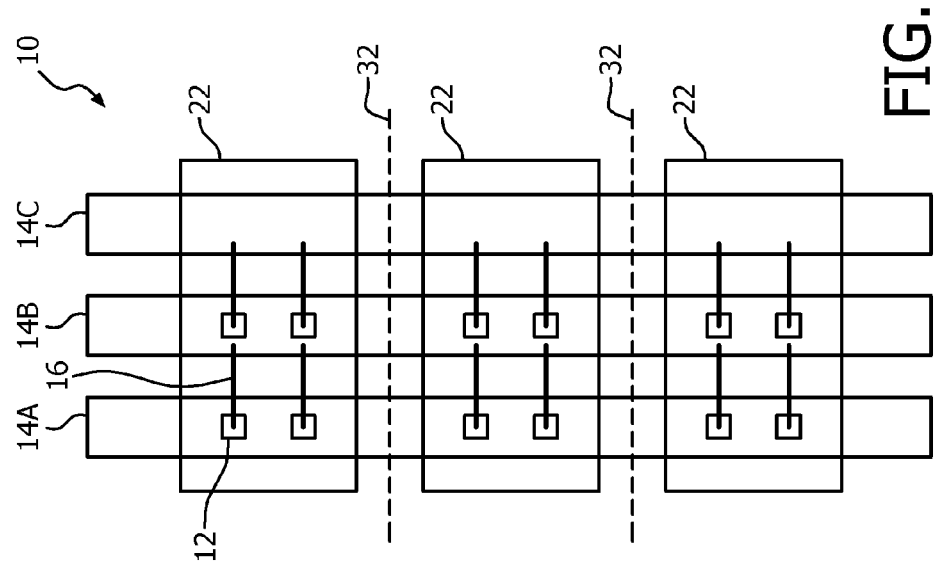
FIG. 8 is a top down view of three copper strips, with six LED dies (connected in parallel) on each of two of the strips, and the two sets of LED dies connected in series with wire bonds.

FIG. 8 is a top down view of a larger portion of the three copper strips 14A, 14B, and 14C, with six LED dies 12 (connected in parallel) on strip 14A, and six LED dies 12 on strip 14B. The two sets of LED dies 12 are connected in series with the wires 16. At this stage, the full lead frame sheet is still in-tact, supporting perhaps hundreds of LED dies. In another embodiment, there are four strips 14 and three groups of LED dies 12, with four LED dies 12 mounted on three of the strips.

A current controller (not shown), for regulating current through the LED dies 12 in a single module, may be connected to the strips 14 of each module at this time. The current controller may consist of one or more resistors connected to different power terminals of the module, and a brightness of the emission depends on which resistor conducts the current. A reverse voltage protection circuit and ESD protection may also be included in the module.

The transparent epoxy castings 22 (FIG. 1) may then be molded around the LED dies 12 and strips 14 for mechanically keeping the group of strips 14 together.

The lead frame sheet is then cut to separate out the individual modules.

Figure 9:
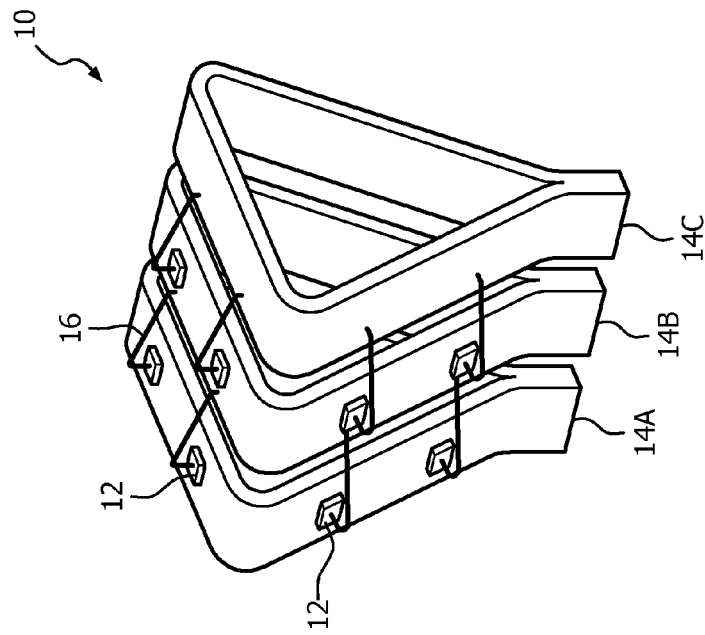
FIG. 9 is a perspective view of a portion of the module after the strips of FIG. 8 have been bent to form a triangle shape. In an actual embodiment, the strips and LED dies would have been encapsulated at the three flat sections of the triangle prior to the bending.

Dashed lines 32 and 34 illustrate where the strips 14 will be bent to form the triangular shape shown in FIG. 9. FIG. 9 does not show the castings 22.

Figure 10:
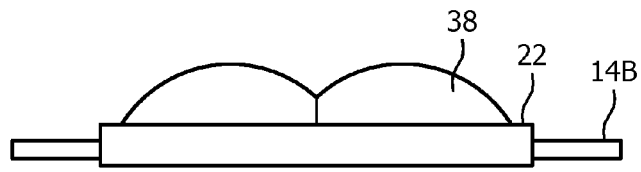
FIG. 10 is a side view of a portion of the module of FIG. 9 showing a molded epoxy casting around a portion of the strips (for mechanical stability) and how a transparent silicone or epoxy lens encapsulates the LED dies.

FIG. 10 illustrates a portion of the strip 14B, showing the casting 22 and lenses 38 (primary optics) formed over the LED dies 12 (connected in parallel). The lenses 38 may be molded over the LED dies 12, or a preformed lens is positioned over each LED die 12 and affixed with a transparent silicone for encapsulating the LED dies 12. If lenses are used, the castings 22 may have openings for the LED dies 12. The optical transmissivity of the lenses 38 or encapsulant should be over 50%.

Figure 11:
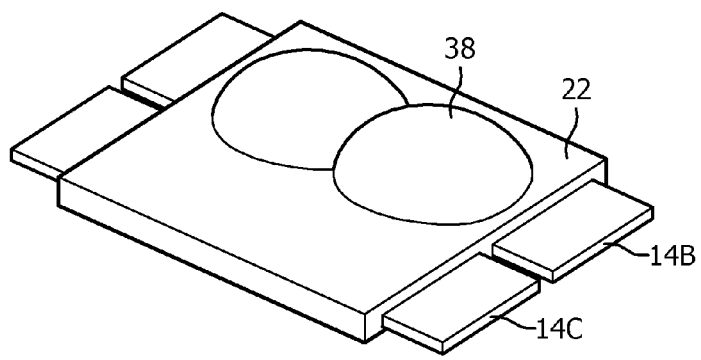
FIG. 11 is a perspective view of the module portion of FIG. 10 showing two strips and the encapsulant over two LED dies connected in parallel.

FIG. 11 is a perspective view of the module portion of FIG. 10, showing two strips 14B and 14C.

Figure 12:
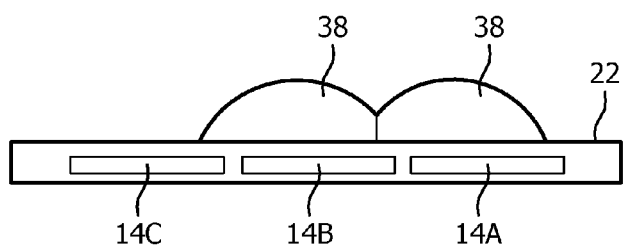
FIG. 12 is a cross-sectional end view of the three strips of FIG. 9 and the encapsulant over the LED dies.

FIG. 12 is a cross-sectional end view of the three strips 14A, 14B, and 14C of FIG. 9, the casting 22 and the lenses 38 over two LED dies connected in series.

Figure 13:
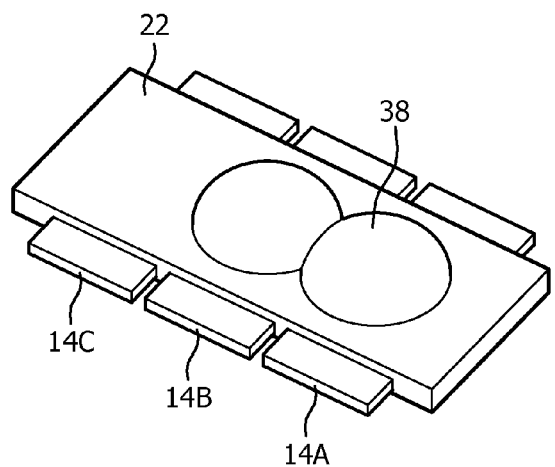
FIG. 13 is a perspective view of the module portion of FIG. 12 showing two encapsulated LED dies connected in series.

FIG. 13 is a perspective view of the module portion of FIG. 12.

Figure 14:
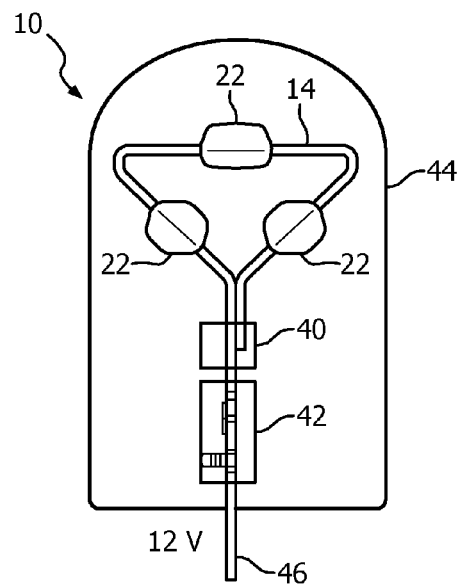
FIG. 14 is a side view of the module portion of FIG. 9 with the castings have been formed, which further shows the current controller portion of the module and a transparent bulb for protection of the electrical structure.

FIG. 14 is a side view of the entire module 10, showing the epoxy castings 22 around potions of the strips 14. The side view shows strip 14A. One end of the strip 14A is inserted into a connector 40 that shorts the end to another portion of the strip 14A and maintains the triangular shape. The ends of the strips 14B and 14C are similarly inserted into the connector 40 for shorting the ends of the respective strips to other portions of the strips and maintaining the triangular shape. By shorting the end of a strip to another portion of the strip after bending, the current is more evenly conducted along the strips. The connector 40 may be a flange that compresses the parts of the strips 14 together when portions of the flange are snapped together by the manufacturer. In some embodiments, it is not necessary to short the ends of a strip, and keep one of the ends of the strip open, which may be fixed by the bulb 44 finally.

The strips 14A and 14C are connected to a current controller 42 for regulating the current through the strips 14A, 14B, and 14C. In one embodiment, the current controller 42 may comprise ESD protection elements and resistors for limiting current. In an embodiment where the module 10 is used for both a stop light and a tail light, the current controller uses a first resistor for the stop light function to provide an increased current (and flux), and second resistor for the tail light function to provide a reduced current (and flux).

The resulting electrical structure is then placed in a transparent plastic or glass bulb 44 for protection. Or the resulting electrical structure could also be over molded with a thermal conductive plastic. While a non-transparent plastic is used, the module 10 should be encapsulated with out-light surfaces of the transparent encapsulant exposed. The shape of the bulb 44 may be a standard T20 bulb size for use in an automobile headlight or tail light assembly, or other application. The bottom of the bulb 44 may include electrical connectors that contact the strips 14A and 14C to provide standardized leads for a T20 socket.

Figure 15:
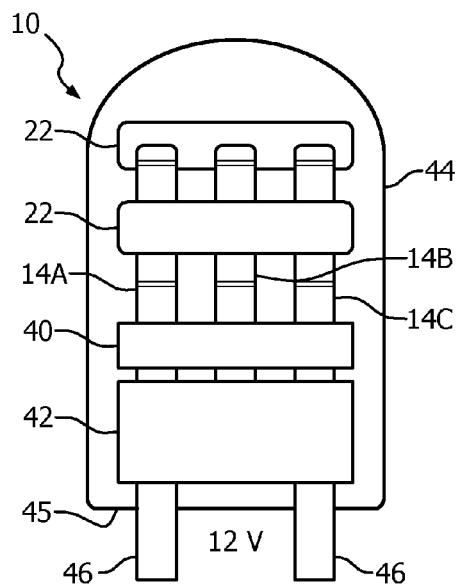
FIG. 15 is a front view of the module of FIG. 14.

FIG. 15 is simplified front view of the module 10 of FIG. 14. The bulb 44 material may be a thermally conductive plastic that is molded around the casting 22 and strips 14 with out-light surfaces of the casting 22 exposed. The casting 22 in FIG. 15 are formed directly in a particular shape as the transparent encapsulant to realize different emission patterns, as well as to provide mechanical support, and protection of the LED dies and the wire bonds. The wide copper strips 14 spread the heat to cool the LED dies. The bulb 44 provides uniform temperature distribution.

In another embodiment, the bulb 44 is hollow and allows air to flow inside. Air openings 45 may be at the bottom of the bulb 44 for air circulation to remove heat from the strips 14. The leads 46 also thermally couple the strips 14 to the socket.

Figure 16:
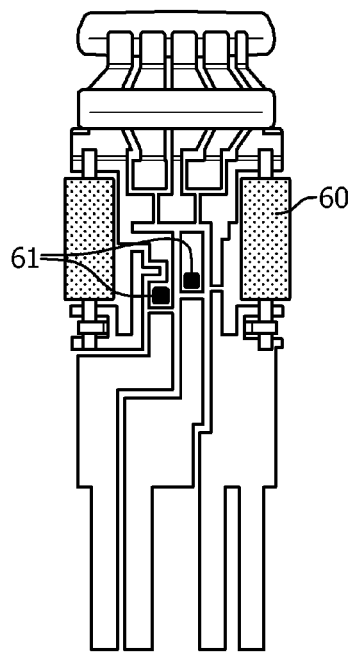
FIGS. 16-18 are perspective views of the lead frames attached with the electric components.
Figure 17:
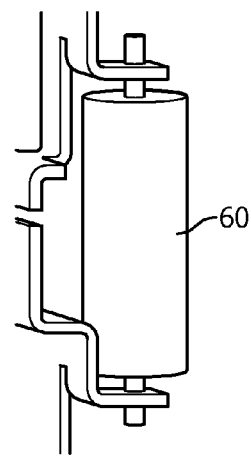
Figure 18:
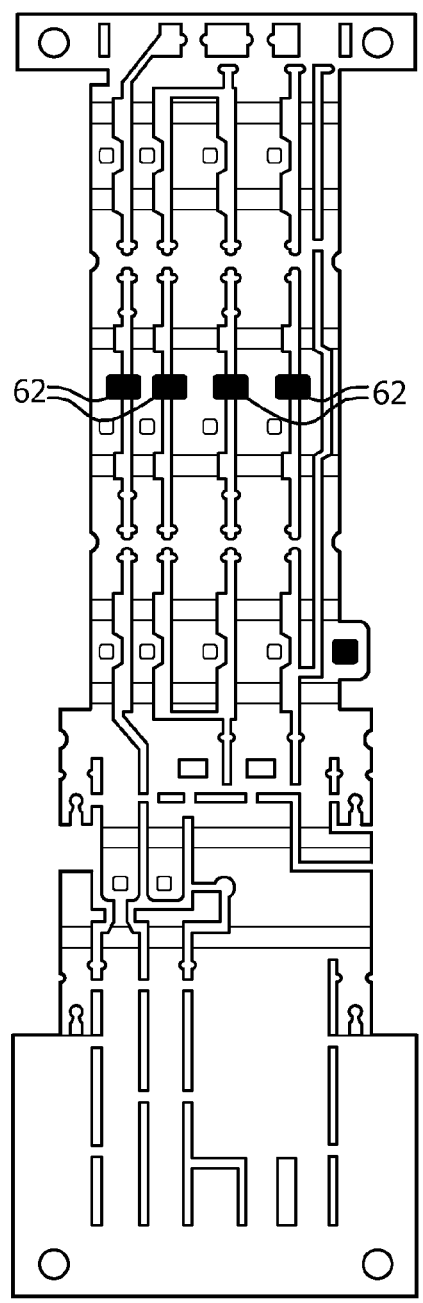

After the bulb 44 encases the electrical portion of the module 10, any lead frame strips 14 extending from the bottom of the bulb 44 may be cut if the bulb 44 itself provides the leads for the socket. The bulb 44 may also be a bulb that meets standards of H series, P series, T series, W series or R series in a bulb form. The resulting lamp (or module or bulb) may have more than two terminals if different brightnesses are desired or different color combinations are desired FIGS. 16-18 demonstrate that the strips 14 are attached with different electric components, including resistors 60, diodes 61, and capacitors 62 to realize a current driving function, a reverse polarity protection function, or an ESD protection.

The location of the LED dies 12 above the bottom of the bulb 44 may be set to be near the focal point of a reflective cavity, such as a headlight or tail light, after the lamp is plugged in.

Figure 19:
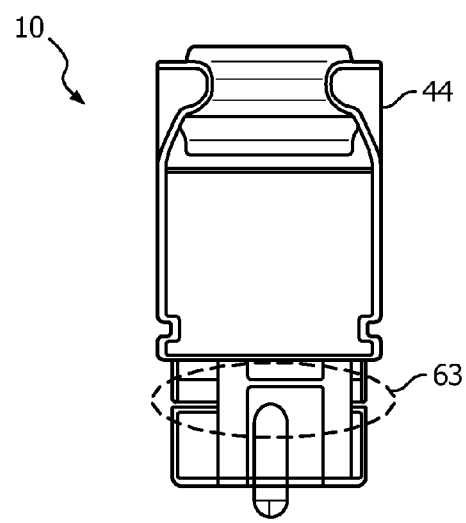
FIG. 19 is a front view of a mechanical reference on the module.
Figure 20:
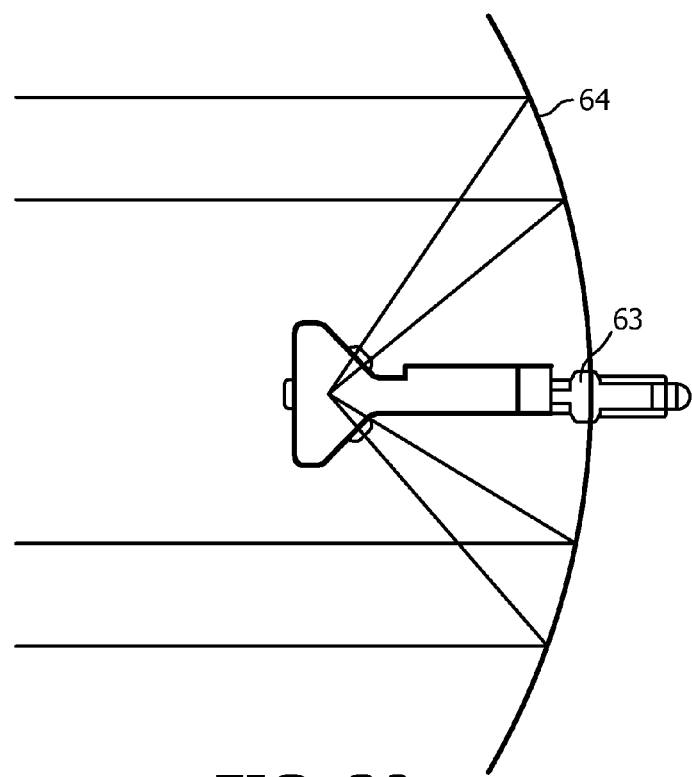
FIG. 20 is a side view illustrating the module is installed in a luminaire.

FIGS. 19-20 show an example of a mechanical reference 63 formed on a thermal conductive plastic as a reference for fixing an optical center of the bulb 44. The bulb 44 itself provides the leads for the socket. While the bulb 44 is installed or plugged in the luminaire 64, the mechanical reference 63 on the bottom part of the bulb 44 may be taken as a reference to match the optical center of the module 10 and the optical center of the luminaire 64. The mechanical reference 63 also can be formed on a transparent bulb or a glass bulb. The mechanical reference 63 could be a wedge-shape or a snap joint.

Figures 21, 22:
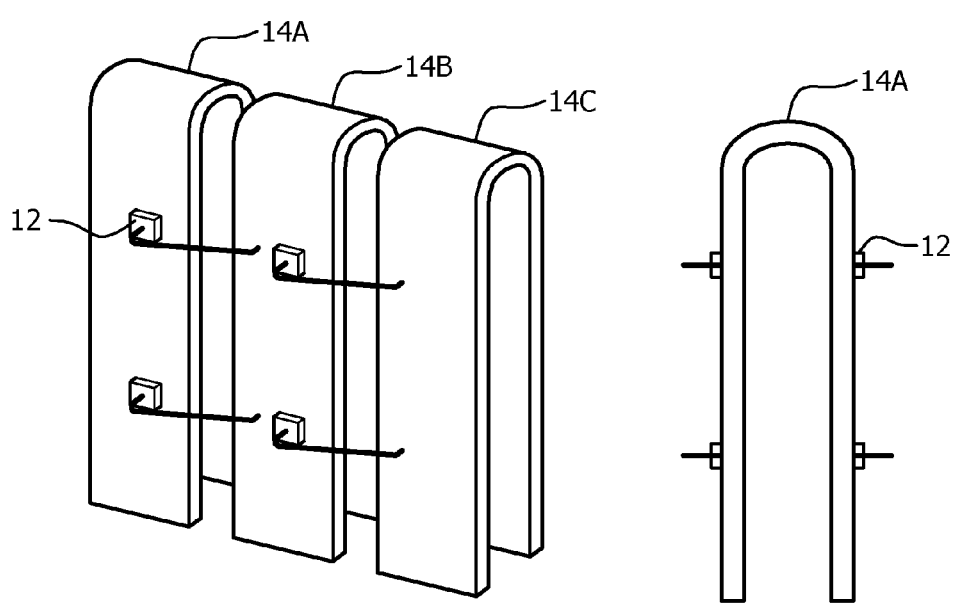
FIG. 21 is a perspective view illustrating the copper strips bent in a U-shape for a different emission pattern. The strips may then be mounted in the way shown in FIGS. 12 and 13.
FIG. 22 is a side view of the strips of FIG. 14.

FIG. 21 is a perspective view illustrating the copper strips 14A, 14B, and 14C bent in a U-shape for a different emission pattern. The strips may then be mounted in the same way shown in FIGS. 14 and 15.

FIG. 22 is a side view of the strips 14 of FIG. 21.

The modules of FIGS. 14 and 21 are particularly suitable for use in a parabolic reflector assembly, such as for a headlight or tail light, where the wide emission pattern is directed in a forward direction by the reflector.

The modules have relatively few parts, resulting in increased reliability.

Any number of LED dies 12 in any number of groups in series and parallel may be provided in a small module size. There is no thermally insulating material between the LED dies 12 and the copper strips 14, causing the heat to be spread by the relatively long and wide copper strips 14. The circulating air, or the thermally conductive bulb 44 material, removes heat from the front, back, and sides of the strips.

Figure 23:
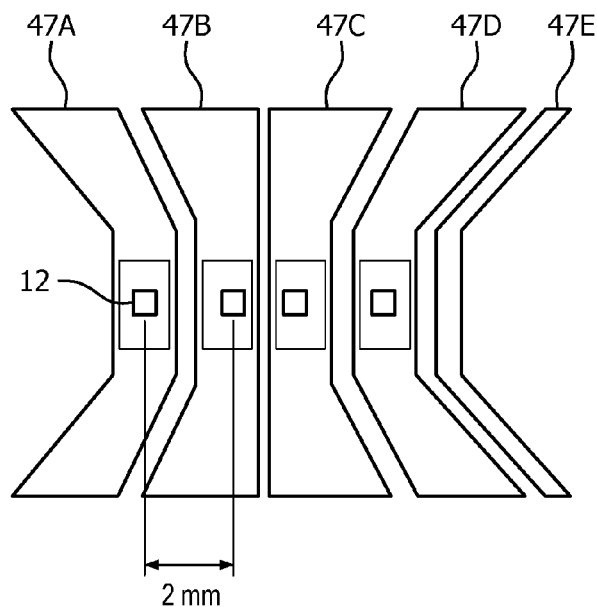
FIG. 23 illustrates how the strips may narrow under the LED dies and then widen to allow the LED dies in a row to be closer together without sacrificing heat sinking by the strips.

FIG. 23 illustrates a portion of a set of copper strips 47A-47E on which a single row of LED dies 12 is mounted and connected in series (the wiring is not shown). More LED dies 12 may be mounted on the strips 47 for connecting in parallel. In order to place the LED dies 12 close together while not sacrificing the heat sinking of the copper strips 47, the strips 47 don't need to be rectangular and can be narrowed in the vicinity of the LED dies 12 and widen out to provide a high thermal mass with a large surface area for cooling. An area of the LED die means a minimum area for mounting the LED die on the strip. The minimal pitch between two adjacent LED dies 12 is no more than 2 mm, as is shown in FIG. 23. The pitch is a distance between centers of two adjacent LED dies. The relationship of areas of the strips and the minimum area of the LED die could satisfy a below formula, in which A1, A2, A3 and A4 represent the minimum area for each LED dies 12, and B1, B2, B3 and B4 represent the area of each strip for thermal dissipation:

$$\frac{B1+B2+B3+B4}{A1+A2+A3+A4} \geq 5 \cdot (A1, A2, A3, A4, B1, B2, B3, B4 \text{ are in mm}^2)$$

Due to a compact arrangement of the LED dies in each row, their photometrical and electrical characteristics merge together, so that different types of LED dies could be used in one row. For example, LED dies with different dominant wavelength, different forward voltage, or different flux could be formed in one row. By combining different bins (wavelength, voltage, flux) of LED dies in one row, the cost for the module could be largely reduced.

Figure 24:
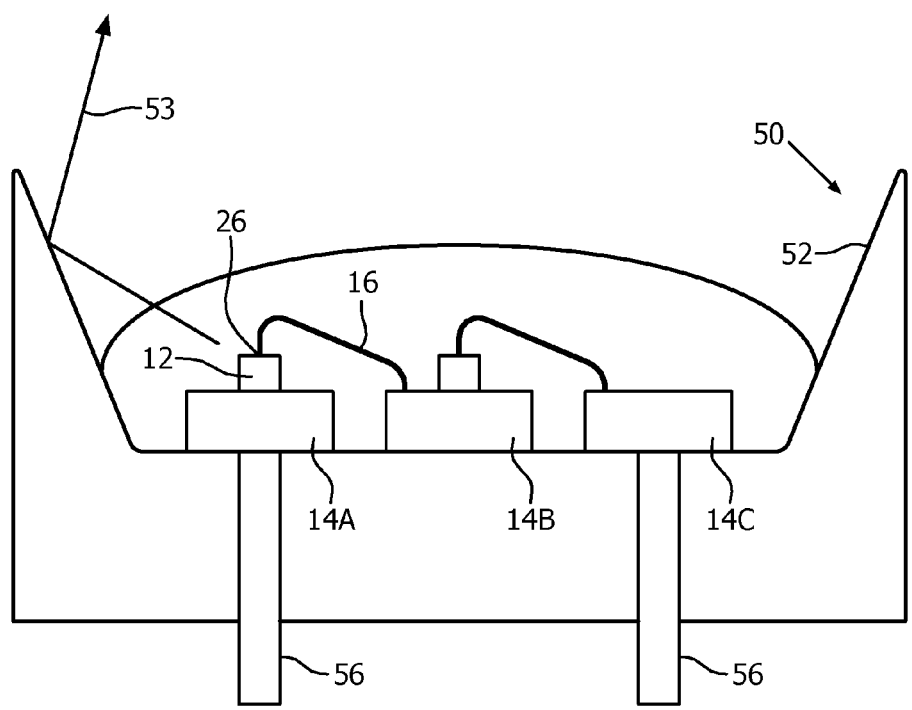
FIG. 24 is a cross-sectional view of a conical reflective cup containing the copper strips and LED dies, such as from FIG. 1.

FIG. 24 illustrates another embodiment of a lamp where a conical reflective cup 50 contains the copper strips 14A, 14B, and 14C and LED dies 12, such as from FIG. 1. The cup 50 may be a thermally conductive ceramic, or metal with an insulating layer, having reflective walls 52. A light ray 53 is shown being directed upward by the reflective walls 52. The LED dies 12 are encapsulated by a transparent encapsulant 54 or an encapsulant that contains a phosphor. Metal leads 56 extend from the strips 14A and 14C to terminate in large pads or leads at the bottom of the cup 50 for connection to a thermally conductive PCB. The strips 14 spread the heat over the cup 50 to remove heat from the LED dies 12, and provide a reflector.

In the various embodiments, the strip 14C is only used for interconnecting the LED dies 12 and does not support any of the LED dies 12 for heat sinking. However, it is convenient to interconnect the LED dies 12 using a portion of the lead frame that also forms the strips 14A and 14B. In some applications, an interconnector other than the strip 14C may be used, and strip 14C is not used.

Other lamp designs are envisioned using the present technique.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting structure comprising:
a plurality of metal lead frame strips, including at least a first strip, a second strip, and a third strip;
a plurality of first light emitting diode (LED) dies, each of the first LED dies having a first electrode and a second electrode, wherein the first electrode of the first LED dies is electrically and thermally coupled to a top surface of the first strip;
a plurality of second LED dies, each of the second LED dies having a third electrode and a fourth electrode, wherein the third electrode of the second LED dies is electrically and thermally coupled to a top surface of the second strip;
the second electrode of the first LED dies being wire bonded to the second strip, and the fourth electrode of the second LED dies being wire bonded to the third strip, to cause the first LED dies to be connected in series with the second LED dies; and
a single-piece, first optically transmissive enclosure molded over a first set of the first LED dies and over a second set of the second LED dies, the first optically transmissive enclosure also being molded around the plurality of lead frame strips to mechanically connect the lead frame strips together;
a single-piece, second optically transmissive enclosure molded over a third set of the first LED dies and over a fourth set of the second LED dies, the second optically transmissive enclosure also being molded around the plurality of lead frame strips to mechanically connect the lead frame strips together,
where there is a gap between the first optically transmissive enclosure and the second optically transmissive enclosure to allow bending of the lead frame strips within the gap,
at least one of the first strip, the second strip and the third strip being configured to be electrically coupled to a power source to supply a current through the first LED dies and the second LED dies;
a housing of a module enclosing the first LED dies, the second LED dies, the first and second optically transmissive enclosures and the metal lead frame strips,
wherein the plurality of lead frame strips are secured together by at least the first optically transmissive enclosure and the second optically transmissive enclosure and bent in a permanent configuration at the gap between the first optically transmissive enclosure and the second optically transmissive enclosure, such that an arrangement of LEDs is fixed within the housing, to form the module having a predetermined light emission profile determined by the fixed arrangement of LEDs in the module.

2. The structure of claim 1 wherein a transmissivity of the first optically transmissive enclosure is no less than 50%.

3. The structure of claim 1 wherein an electric controller is coupled to at least one of the strips for electrically controlling the light emitting structure.

4. The structure of claim 3 wherein the electric controller comprises one or more resistors, capacitors and/or diodes.

5. The structure of claim 1 wherein any two of LED dies coupled on any one of strips are different types of LED dies, while a plurality of LED dies are mounted on any one of strips.

6. The structure of claim 1 wherein any of the strips has at least one raised section where at least one LED die is to be mounted.

7. The structure of claim 1 wherein the strips are bent at least between any two rows of the LED dies to cause top surfaces of the LED dies in one row, and the LED dies in another row to face in different directions to achieve a desired emission pattern.

8. The structure of claim 7 wherein the strips are bent within the enclosure to have a triangular shape.

9. The structure of claim 1 wherein a pitch between any two of adjacent LED dies in a row of the at least one first LED die and the at least one second LED die is less than 2 mm.

10. The structure of claim 1 wherein LED dies in one row and LED dies in another row are different types of LEDs, while more than one LED dies coupled on the first strips and the second strips.

11. The structure of claim 1 wherein a total area of the strips is at least five times of a total area of LED dies coupled on the strips.

12. The structure of claim 1 wherein the number of the at least one first LED die coupled on the first strip is different from the number of the at least one second LED die coupled on the second strip.

13. The structure of claim 1 wherein the module has a bulb shape with electrical terminals extending therefrom for connection to socket terminals.

14. The structure of claim 1 wherein the structure forms a module comprising at least four LED dies.

* * * * *